United States Patent
Wang et al.

(10) Patent No.: US 9,496,172 B2
(45) Date of Patent: Nov. 15, 2016

(54) METHOD FOR FORMING INTERCONNECTION STRUCTURES

(71) Applicant: ACM Research (Shanghai) Inc., Shanghai (CN)

(72) Inventors: Jian Wang, Shanghai (CN); Zhaowei Jia, Shanghai (CN); Hui Wang, Shanghai (CN)

(73) Assignee: ACM Research (Shanghai) Inc., Shanghai (CN)

( * ) Notice: Subject to any disclaimer, the term of this patent is extended or adjusted under 35 U.S.C. 154(b) by 0 days.

(21) Appl. No.: 14/647,706

(22) PCT Filed: Nov. 27, 2012

(86) PCT No.: PCT/CN2012/085320
§ 371 (c)(1),
(2) Date: May 27, 2015

(87) PCT Pub. No.: WO2014/082197
PCT Pub. Date: Jun. 5, 2014

(65) Prior Publication Data
US 2015/0318205 A1  Nov. 5, 2015

(51) Int. Cl.
*H01L 21/768* (2006.01)
*H01L 21/321* (2006.01)
*H01L 23/522* (2006.01)

(52) U.S. Cl.
CPC ... *H01L 21/76843* (2013.01); *H01L 21/32115* (2013.01); *H01L 21/7684* (2013.01); *H01L 21/76802* (2013.01); *H01L 21/76865* (2013.01); *H01L 23/522* (2013.01); *H01L 2924/0002* (2013.01)

(58) Field of Classification Search
None
See application file for complete search history.

(56) References Cited

U.S. PATENT DOCUMENTS

| 6,683,382 B2 * | 1/2004 | Cwynar ............ H01L 21/76819 257/208 |
| 2001/0027008 A1 | 10/2001 | Matsumoto |
| 2005/0064634 A1 | 3/2005 | Schmidt et al. |
| 2006/0276030 A1 * | 12/2006 | Wang ............... H01L 21/02068 438/631 |
| 2009/0001587 A1 * | 1/2009 | Cotte ................ H01L 21/32135 257/751 |
| 2012/0168958 A1 | 7/2012 | Zhang et al. |

FOREIGN PATENT DOCUMENTS

WO   03/019641 A1   3/2003

OTHER PUBLICATIONS

International Search Report issued in PCT/CN2012/085320 mailed on Aug. 29, 2013 (3 pages).
Written Opinion of the International Searching Authority issued in PCT/CN2012/085320 mailed on Aug. 29, 2013 (4 pages).

* cited by examiner

*Primary Examiner* — Asok K Sarkar
(74) *Attorney, Agent, or Firm* — Osha Liang LLP

(57) ABSTRACT

The present invention provides a method for forming interconnection structures, including the following steps: providing a semiconductor wafer with a dielectric layer; forming a first recessed area for forming the interconnection structures and a non-recessed area on the dielectric layer; forming a second recessed area for forming dummy structures on the dielectric layer; depositing a barrier layer to cover the first and second recessed areas and the non-recessed area; depositing a metal layer to fill the first and second recessed areas and cover the non-recessed area; removing the metal layer on the non-recessed area to expose the barrier layer; and removing the barrier layer on the non-recessed area to expose the dielectric layer.

14 Claims, 9 Drawing Sheets

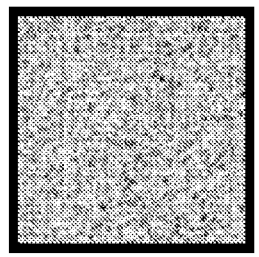
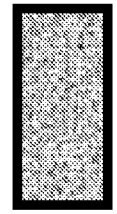
FIG 8(a)     FIG 8(b)     FIG 8(c)
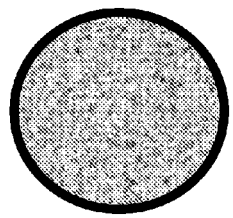
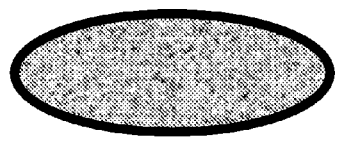
FIG 8(d)     FIG 8(e)
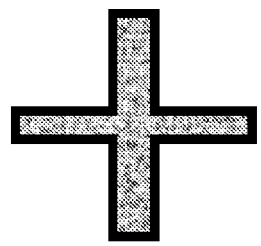
FIG 8(f)     FIG 8(g)
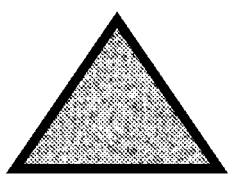
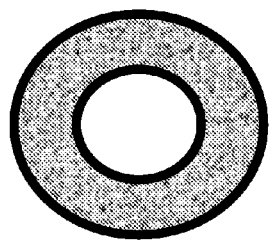
FIG 8(h)     FIG 8(i)

METHOD FOR FORMING INTERCONNECTION STRUCTURES

BACKGROUND OF THE INVENTION

1. Field of the Invention

The present invention generally relates to the field of fabricating semiconductor devices, and more particularly to a method for forming interconnection structures in the semiconductor devices.

2. The Related Art

Semiconductor devices are generally manufactured or fabricated on semiconductor material such as wafers by using a number of processing steps. The wafers may undergo multiple masking, etching and deposition processing steps to form electronic circuitry of the semiconductor devices. With high integration of the semiconductor devices, metal interconnection structures have developed rapidly in the field of fabricating semiconductor devices. The multiple masking and etching processes can be used to form recessed areas in the wafer, such as trenches, vias, and the like. The deposition process can be used to deposit a metal layer onto both the recessed areas and non-recessed areas of the wafer. After deposition, the metal layer on the non-recessed areas of the wafer is removed and the metal left in the recessed areas of the wafer form the interconnection structures. Particularly, the metal layer is deposited on a dielectric layer formed on the wafer, so in order to prevent the diffusion or leaching of the metal layer into the dielectric layer, a barrier layer is deposited on the dielectric layer before depositing the metal layer and the metal layer is then deposited on the barrier layer.

Conventional methods including, for example, chemical mechanical polishing (CMP) are adopted to remove the metal layer and the barrier layer on the non-recessed areas of the wafer. The CMP method is widely used in the semiconductor industry to polish and planarize the metal layer on the non-recessed areas of the wafer to form the interconnection structures. In a CMP process, the wafer is positioned on a CMP pad located on a platen. A force is then applied to press the wafer against the CMP pad. The CMP pad and the wafer are moved against and relative to one another while applying the force to polish and planarize the metal layer. A polishing solution, often referred to as polishing slurry, is dispensed on the CMP pad to facilitate the polishing. However, the CMP method has several deleterious effects on the semiconductor structure formed on the wafer because of the involved relatively strong mechanical force applied on the metal layer and the barrier layer in the CMP process.

Another method for removing the metal layer deposited on the non-recessed areas of the wafer is electropolishing. The electropolishing method can remove the metal layer with high uniformity and have high selectivity to the barrier layer. It is a mechanical stress free process. However, during the electropolishing process, in order to remove all the metal layer on the non-recessed areas of the wafer, over polish is conducted. But it is found that at the areas, such as field area, wide space area between two adjacent metal lines, and space area at two sides of an isolated metal line, because there is no metal on the non-recessed areas and the barrier layer is exposed after the metal layer is removed at the over polishing stage, the current is conducted through the barrier layer. Then the surface of the barrier layer will be oxidized to form an oxidization film on the top surface of those areas. Or in other words, the oxidization film is thicker at the areas having lower interconnection structure density than at the areas having higher interconnection structure density. Since the metal layer, such as copper, has much lower resistance, the current will mostly go through the metal layer instead of going through the barrier layer. The oxidization film prevents the barrier layer being removed in the barrier layer removal step, and the barrier layer can not be uniformly removed, causing the semiconductor device failure.

SUMMARY

Accordingly, an object of the present invention is to provide a method for forming interconnection structures, including the following steps: providing a semiconductor wafer with a dielectric layer; forming a first recessed area for forming the interconnection structures and a non-recessed area on the dielectric layer; forming a second recessed area for forming dummy structures on the dielectric layer; depositing a barrier layer to cover the first and second recessed areas and the non-recessed area; depositing a metal layer to fill the first and second recessed areas and cover the non-recessed area; removing the metal layer on the non-recessed area to expose the barrier layer; and removing the barrier layer on the non-recessed area to expose the dielectric layer.

As described above, because of the dummy structures, when the metal layer is removed from the non-recessed area, the current is mostly conducted through the dummy structures and the surface of the barrier layer will not be oxidized, because the electrical conductivity of the metal layer is much higher than that of the barrier layer. The barrier layer on the non-recessed area can be removed easily, uniformly and completely, ensuring the quality of a semiconductor device having the interconnection structures.

BRIEF DESCRIPTION OF THE DRAWINGS

The present invention will be apparent to those skilled in the art by reading the following description of preferred embodiments thereof, with reference to the attached drawings, in which:

FIGS. 8(a)~(i) show various exemplary shapes that can be used to form the dummy structure;

DETAILED DESCRIPTION OF EMBODIMENTS

Figure 1:
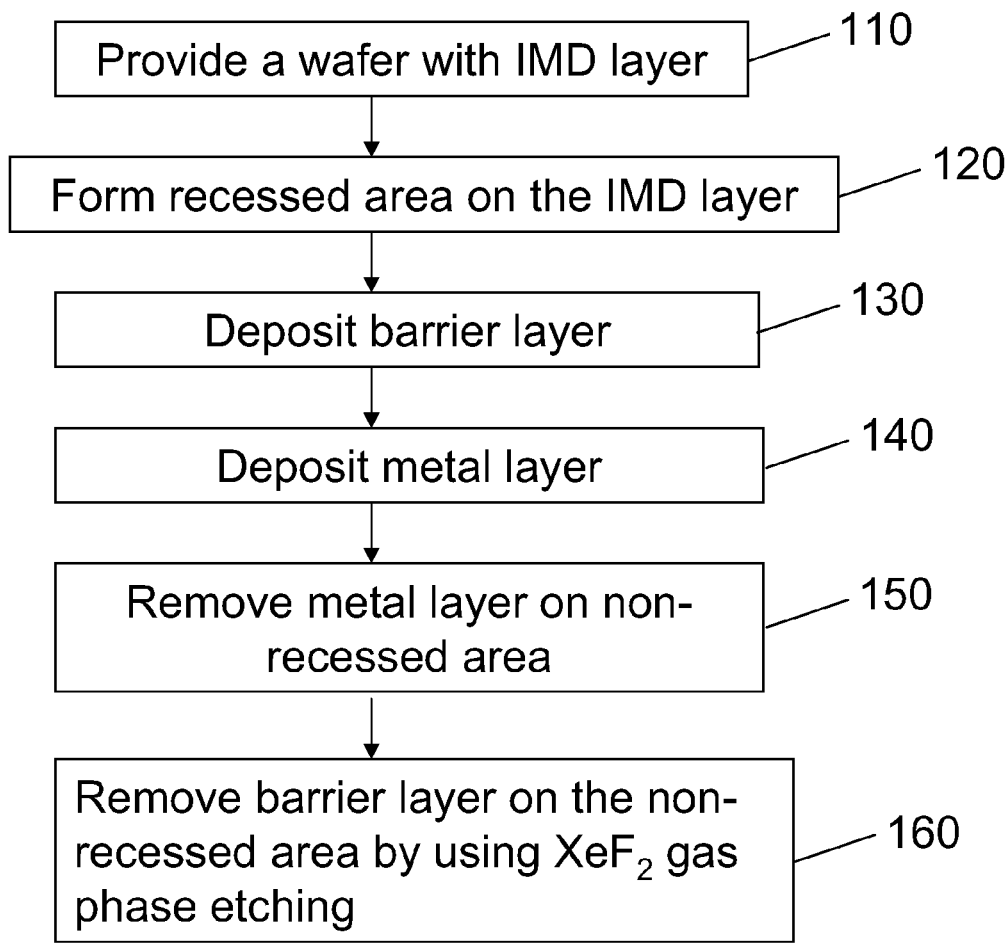
FIG. 1 is a flow chart showing an exemplary damascene process.
Figure 2:
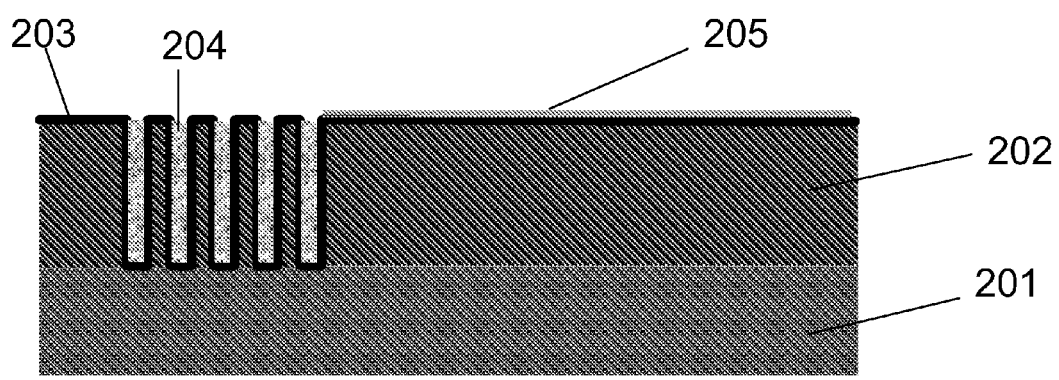
FIG. 2 is a cross-sectional view showing the exemplary damascene process.
Figure 3:
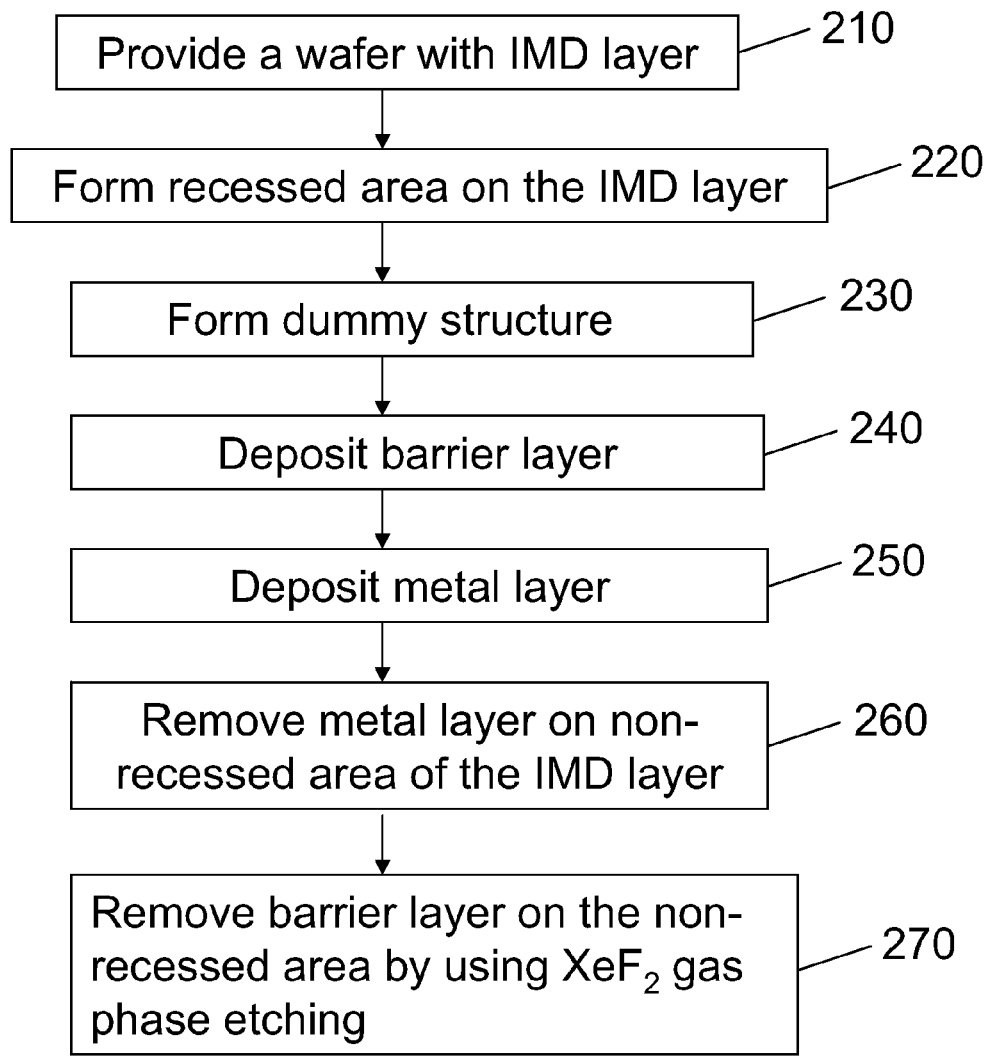
FIG. 3 is a flow chart showing another exemplary damascene process.
Figure 4:
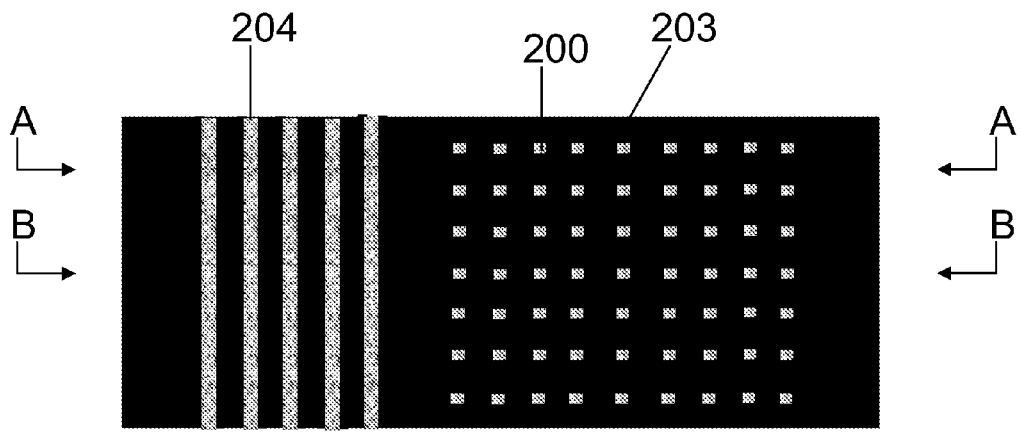
FIG. 4 is a top view showing an exemplary dummy structure formed at a field area of a wafer before a barrier layer removed.
Figure 4A:
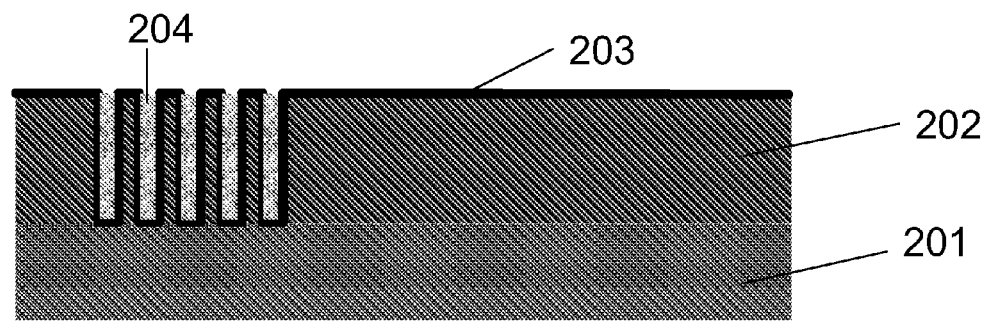
FIG. 4(a) is a cross-sectional view taken along line A-A of FIG. 4.
Figure 4B:
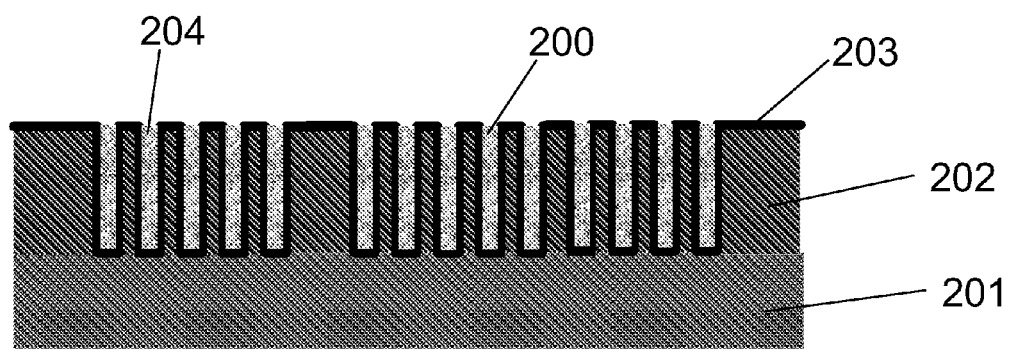
FIG. 4(b) is a cross-sectional view taken along line B-B of FIG. 4.

Referring to FIG. 1 and FIG. 2, an exemplary damascene process is depicted which can be used to form interconnection structures in a semiconductor device. In step 110, a wafer 201 or other substrate is provided. The wafer 201 has an inter-metal dielectric (IMD) layer 202 formed thereon. The IMD layer 202 can include materials such as silicon dioxide and the like, or materials having dielectric constants lower than silicon dioxide, which can be used to lower the capacitance between the interconnection structures in the semiconductor device. In step 120, first recessed areas, for example, trenches, vias, etc., are formed on the IMD layer 202 for forming the interconnection structures. In step 130, a barrier layer 203 is deposited on the IMD layer 202 by any convenient deposition method, such as chemical vapor deposition (CVD), physical vapor deposition (PVD), atomic layer deposition (ALD), and the like, such that the barrier layer 203 covers both the first recessed areas and non-recessed areas of the IMD layer 202. Because the IMD layer 202 can have a porous microstructure, the barrier layer 203 can include materials that can prevent the diffusion or leaching of a subsequently deposited metal layer 204 into the IMD layer 202. Furthermore, the barrier layer 203 can be formed from a conductive material, which adheres to both the IMD layer 202 and the metal layer 204. For instance, the barrier layer 203 can include materials such as titanium, tantalum, tungsten, titanium nitride, tantalum nitride, tungsten nitride, tantalum silicon nitride, tungsten silicon nitride, and the like.

In step 140, the metal layer 204 is deposited on the barrier layer 203 by any convenient method, such as PVD, CVD, ALD, electroplating and the like. Furthermore, in some applications, such as when plating is used to deposit the metal layer 204, a seed layer can be deposited onto the barrier layer 203 before depositing the metal layer 204. The seed layer can include the same material as the metal layer 204 in order to facilitate the deposition and bonding of the metal layer 204 onto the barrier layer 203. The metal layer 204 fills the first recessed areas and covers the non-recessed areas of the IMD layer 202. Besides, the metal layer 204 can include various electrically conductive materials, such as copper, aluminum, nickel, zinc, silver, gold, tin, chromium, superconductor materials, and the like. Preferably, the metal layer 204 can include copper. Furthermore, it should be recognized that the metal layer 204 can include an alloy of any of the various electrically conductive materials, or compound of superconductor.

In step 150, after the metal layer 204 is deposited, the metal layer 204 then should be removed from the non-recessed areas by any convenient method, such as electropolishing and the like. It should be recognized that polishing the metal layer 204 from the non-recessed areas can include removing the metal layer 204 from the non-recessed areas of the barrier layer 203 deposited on the IMD layer 202. For a description of electropolishing, please see U.S. patent application Ser. No. 09/497,894, filed on Feb. 4, 2000, which is incorporated in its entirety herein by reference.

Subsequently, in step 160, after removing the metal layer 204 from the non-recessed areas, the barrier layer 203 is removed from the non-recessed areas by any convenient method, such as wet etching, dry chemical etching, dry plasma etching, and the like. Preferably, the barrier layer 203 is removed by using $XeF_2$ gas phase etching. As shown in FIG. 2, in order to remove all the metal layer 204 on the non-recessed areas, when the metal layer 204 is removed from the non-recessed areas, over polish is conducted. Because there is no metal layer 204 on the non-recessed areas and the barrier layer 203 is exposed after the metal layer 204 is removed at the over polishing process, the current is conducted through the barrier layer 203, causing the surface of the areas, such as field area, wide space area between two adjacent metal lines, and space area at two sides of an isolated metal line, of the barrier layer 203 to be oxidized to form an oxidization film 205 thereon. Before removing the barrier layer 203, the oxidization film 205 must be removed in advance. Besides, the oxidization film 205 thickness is associated with the interconnection structure density. In other words, the oxidization film 205 is thicker at the areas having lower interconnection structure density than at the areas having higher interconnection structure density. Since the metal layer 204, such as copper, has much lower resistance, the current will mostly go through the metal layer 204 instead of going through the barrier layer 203. The oxidization film 205 can prevent the barrier layer 203 being removed in the barrier layer 203 removal step, and the barrier layer 203 can not be uniformly removed, causing the semiconductor device failure.

Accordingly, referring to FIG. 3 to FIG. 5(b), depicting another exemplary damascene process that can be used to form interconnection structures in a semiconductor device, compared to the above damascene process, this damascene process can include dummy structures 200 at the field area to avoid producing the oxidization film 205 on the barrier layer 203 when over polishing the metal layer 204. This damascene process is similar in many respects to the above damascene process, except that the dummy structures 200 are included at the field area. This damascene process will be briefly described hereinafter.

In step 210, a wafer 201 or other substrate is provided. The wafer 201 has an inter-metal dielectric (IMD) layer 202 formed thereon. The IMD layer 202 can include materials such as silicon dioxide and the like, or materials having dielectric constants lower than silicon dioxide, which can be used to lower the capacitance between the interconnection structures in the semiconductor device.

In step 220, first recessed areas, for example, trenches, vias, etc., are formed on the IMD layer 202 for forming the interconnection structures.

In step 230, second recessed areas, for example, trenches, vias, etc., are formed at the predetermined field area of the IMD layer 202 for forming the dummy structures 200. The dummy structures 200 can be formed at the same time that the interconnection structures are formed, and the depth and width of the dummy structures 200 are the same as the interconnection structures. It should be recognized that the dummy structures 200 can be formed independently and the depth and width of the dummy structures 200 can be not the same as the interconnection structures.

In step 240, a barrier layer 203 is deposited on the IMD layer 202 by any convenient deposition method, such as chemical vapor deposition (CVD), physical vapor deposition (PVD), atomic layer deposition (ALD), and the like, such that the barrier layer 203 covers both the recessed areas, including the first and second recessed areas and non-recessed areas of the IMD layer 202.

In step 250, a metal layer 204 is deposited on the barrier layer 203 by any convenient method, such as PVD, CVD, ALD, electroplating and the like. Furthermore, in some applications, such as when plating is used to deposit the metal layer 204, a seed layer can be deposited onto the barrier layer 203 before depositing the metal layer 204. The seed layer can include the same material as the metal layer 204 in order to facilitate the deposition and bonding of the metal layer 204 onto the barrier layer 203. The metal layer 204 fills the recessed areas, including the first and second recessed areas and covers the non-recessed areas of the IMD layer 202.

In step 260, after the metal layer 204 is deposited, the metal layer 204 then should be removed from the non-recessed areas by any convenient method, such as electropolishing and the like. It should be recognized that polishing the metal layer 204 from the non-recessed areas can include removing the metal layer 204 from the non-recessed areas of the barrier layer 203 deposited on the IMD layer 202. Preferably, the metal layer 204 removing process can include two steps. The first step is that a partial metal layer 204 is removed by using the CMP method to achieve better surface planarity, and the subsequent step is that the rest metal layer 204 is removed by using the electropolishing method, avoiding damaging the semiconductor device.

Figure 5:
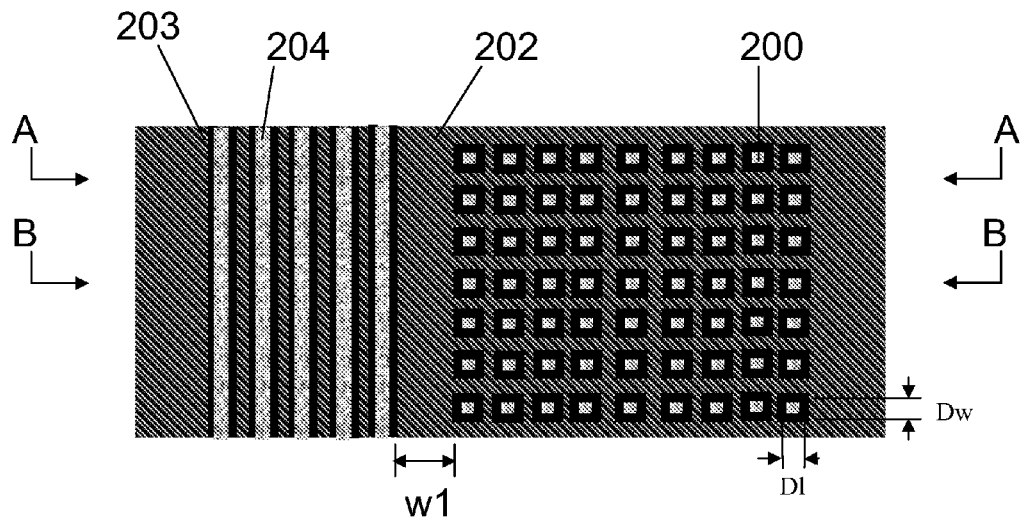
FIG. 5 is a top view showing the exemplary dummy structure formed at the field area of the wafer after the barrier layer removed.
Figure 5A:
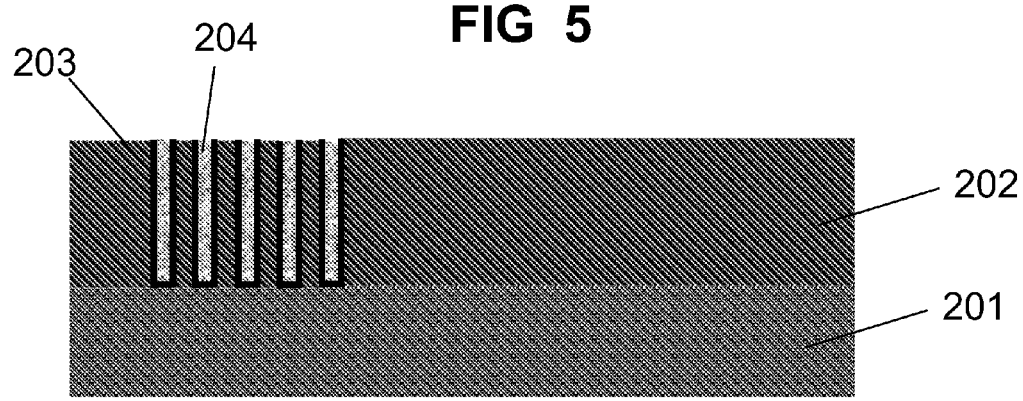
FIG. 5(a) is a cross-sectional view taken along line A-A of FIG. 5.
Figure 5B:
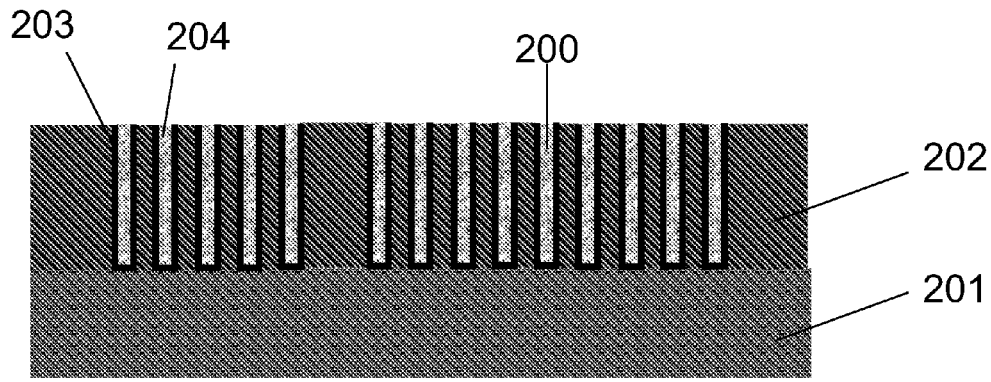
FIG. 5(b) is a cross-sectional view taken along line B-B of FIG. 5.

In step 270, after removing the metal layer 204 from the non-recessed areas, the barrier layer 203 is removed from the non-recessed areas by any convenient method, such as wet etching, dry chemical etching, dry plasma etching, and the like. Preferably, the barrier layer 203 is removed by using $XeF_2$ gas phase etching. The metal layer 204 remained in the first recessed areas which are used for forming the interconnection structures is formed the interconnection structures. The metal layer 204 remained in the second recessed areas which are used for forming the dummy structures 200 is used to form the dummy structures 200. It should be recognized that the material of the dummy structures 200 can be not the same as the interconnection structures. As shown in FIG. 5 to FIG. 5(b), because the field area includes the dummy structures 200, even the metal layer 204 is over polished, for the resistance of the dummy structures 200 is much lower than that of the barrier layer 203, the current is mostly conducted through the dummy structures 200 and the surface of the barrier layer 203 will not be oxidized. The barrier layer 203 on the non-recessed areas of the IMD layer 202 can be removed easily and uniformly.

As shown in FIGS. 3 to 5(b), the density of the dummy structures 200 formed at the field area can be chosen in the range of 50% to 100% of that of the interconnection structure. The distance W1 between the adjacent interconnection structure and the dummy structure 200 can be chosen in the range of 20 nm to 5000 nm. The size of the dummy structures 200 can be chosen in the range of 20 nm to 5000 nm, and more specifically, the width D1 of the dummy structure 200 can vary from 20 nm to 5000 nm, the length Dw of the dummy structure 200 can vary from 20 nm to 5000 nm.

Figure 6:
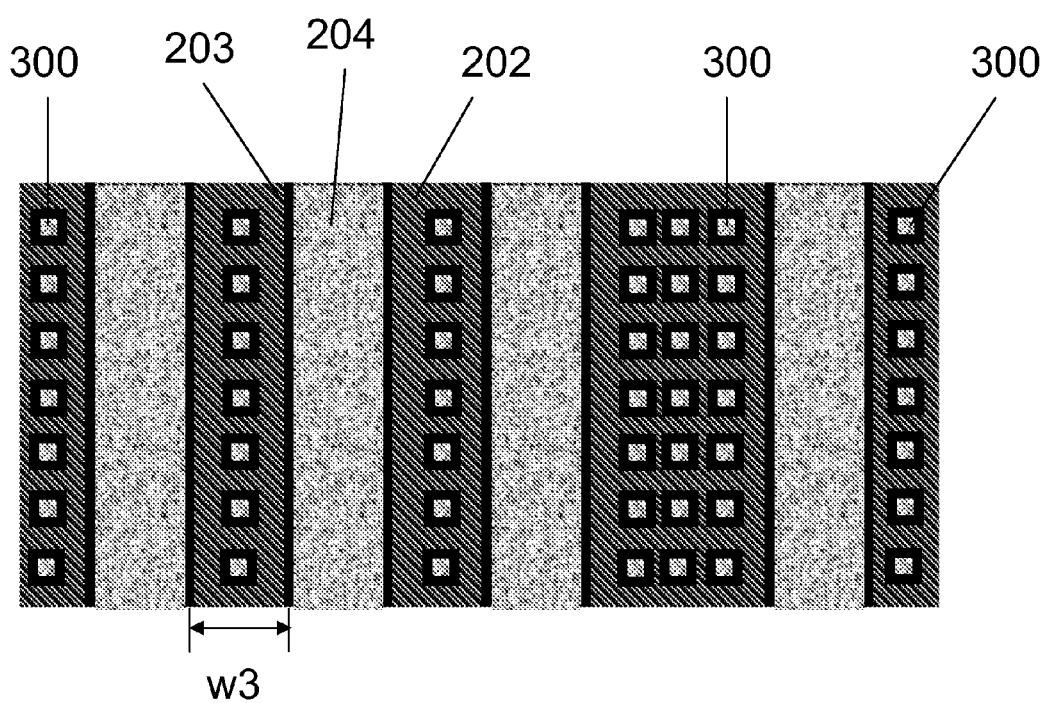
FIG. 6 is a top view showing an exemplary dummy structure formed at wide space areas between adjacent metal lines of a wafer after a barrier layer removed.

In some applications, if the space between metal lines also referred to as the interconnection structures is too wide, the oxidization of the barrier layer 203 will be happened too when over polishing the metal layer 204. So at the wide space areas between adjacent metal lines, there can be included dummy structures 300, as shown in FIG. 6. The width W3 of the wide space area can be 60 nm or wider. The size of the dummy structures 300 can be as same as the dummy structures 200.

Figure 7:
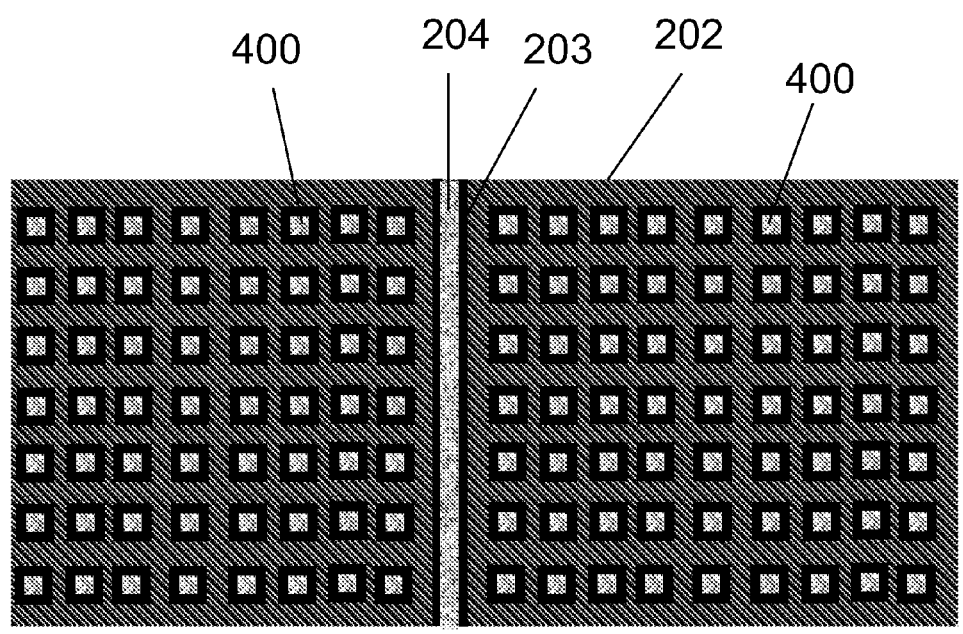
FIG. 7 is a top view showing an exemplary dummy structure formed at space areas at two sides of an isolated metal line of a wafer after a barrier layer removed.

In some applications, if two sides of an isolated metal line are too wide, the oxidization of the barrier layer 203 will be happened too when over polishing the metal layer 204. So at the space areas of the two sides of the isolated metal line, there can be included dummy structures 400, as shown in FIG. 7. The density of the dummy structures 400 can be chosen in the range of 20% to 80%. The size of the dummy structures 400 can be as same as the dummy structures 200.

With reference to FIGS. 8(a)~(i), various exemplary shapes that can be used to form the dummy structures 200, 300, 400 are shown, such as square, vertical rectangle, horizontal rectangle, round shape, oval shape, cross shape, elliptical shape, triangle shape, arc shape and the like. It should be recognized that although particular exemplary shapes are depicted in FIGS. 8(a)~(i), any shape can be used to form the dummy structures 200, 300, 400 depending on the particular application and the dummy structures 200, 300, 400 can include one or more different shapes.

Figure 9A:
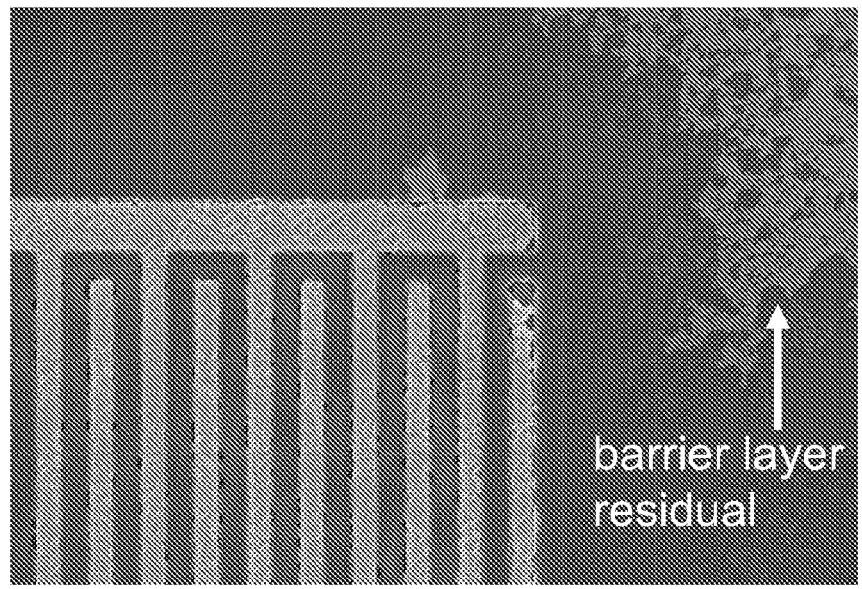
FIG. 9(a) is a SEM top view showing a wafer having no dummy structures after a barrier layer removing process.
Figure 9B:
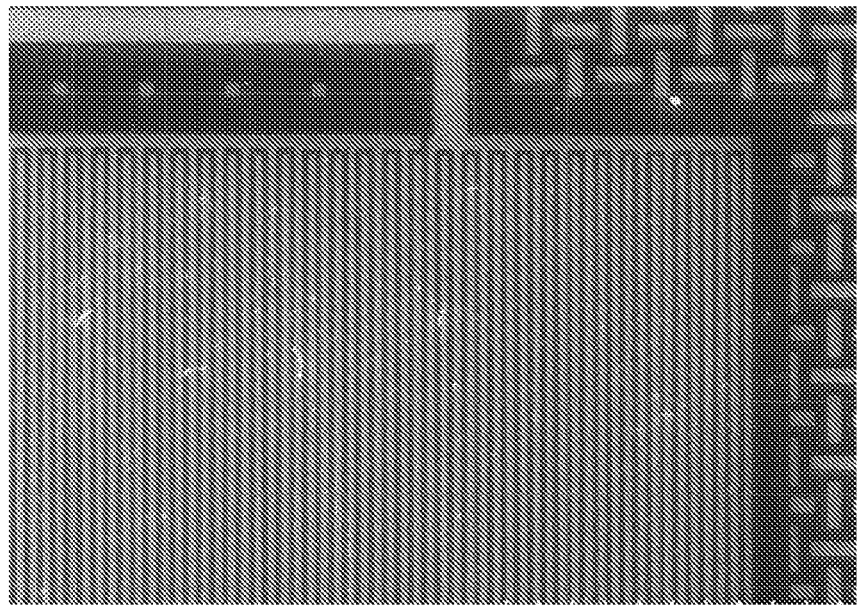
FIG. 9(b) is a SEM top view showing a wafer having the dummy structures after the barrier layer removing process.

Please refer to FIG. 9(a) and FIG. 9(b). FIG. 9(a) is a SEM top view showing a wafer 201 having no dummy structures 200 at the field area after a barrier layer 203 removing process. It can be seen that the barrier layer 203 around the interconnection structures is removed completely, but at the field area, the barrier layer 203 isn't removed completely. There is some residual barrier layer 203. Comparatively, FIG. 9(b) is a SEM top view showing a wafer 201 having the dummy structures 200 at the field area after the barrier layer 203 removing process. It can be seen that the barrier layer 203 is removed completely at the field area.

As described above, the present invention utilizes the dummy structures 200, 300, 400 formed at the field area, the wide space area between two adjacent metal lines and the space area at two sides of an isolated metal line to avoid the barrier layer 203 being oxidized when over polishing the metal layer 204, so the barrier layer 203 can be removed easily, completely and uniformly, ensuring the quality of the semiconductor device. It should be recognized that the dummy structures 200, 300, 400 can also be formed at the area which has less pattern density than other area.

The foregoing description of the present invention has been presented for purposes of illustration and description. It is not intended to be exhaustive or to limit the invention to the precise form disclosed, and obviously many modifications and variations are possible in light of the above teaching Such modifications and variations that may be apparent to those skilled in the art are intended to be included within the scope of this invention as defined by the accompanying claims.

What is claimed is:
1. A method for forming interconnection structures, comprising:
   providing a semiconductor water with a dielectric layer;
   forming a first recessed area for forming the interconnection structures and a non-recessed area on the dielectric layer;
   forming a second recessed area for forming dummy structures on the dielectric layer;
   depositing a barrier layer to cover the first and second recessed areas and the non-recessed area;
   depositing as metal layer to fill the first and second recessed areas and cover the non-recessed area;
   removing the metal layer on the non-recessed area to expose the barrier layer, wherein removing the metal layer includes using an electropolishing method and the dummy structures prevent the barrier layer from being oxidized; and
   removing the harrier layer on the non-recessed area to expose the dielectric layer.

2. The method as claimed in claim 1, wherein the dummy structures are formed at a field area of the dielectric layer.

3. The method as claimed in claim 2, wherein the density of the dummy structures is in the range of 50% to 100% of that of the interconnection structures.

4. The method as claimed in claim 2, wherein the distance W1 between the adjacent interconnection structure and the dummy structure is in the range of 20 nm to 5000 nm.

5. The method as claimed in claim 1, wherein the size of the dummy structure is in the range of 20 nm to 5000 nm, the width D1 of the dummy structure is in the range of 20 nm to 5000 nm, the length Dw of the dummy structure is in the range of 20 nm to 5000 nm.

6. The method as claimed in claim 1, wherein the dummy structures are formed at a wide space area between two adjacent metal lines in the dielectric layer.

7. The method as claimed in claim 6, wherein the Width W3 of the wide space area is 60 nm or wider.

8. The method as claimed in claim 1, wherein the dummy structures are formed at space areas of two sides of an isolated metal line in the dielectric layer.

9. The method as claimed in claim 8, wherein the density of the dummy structures is in the range of 20% to 80%.

10. The method as claimed in claim 1, wherein the dummy structures include one or more different shapes.

11. The method as claimed in claim 1, wherein the dummy structures are formed at the same time that the interconnection structures are formed.

12. The method as claimed in claim 1, wherein the material of the dummy structures is the same as the interconnection structures.

13. The method as claimed in claim 1, wherein the step of removing the metal layer on the non-recessed area to expose the harrier layer includes firstly removing a partial metal layer by using a CMP method and then removing the rest metal layer by using an electropolishing method.

14. The method as claimed in claim 1, wherein removing the barrier layer by using a $XeF_2$ gas phase etching method.

* * * * *